(12) United States Patent
Bellotti et al.

(10) Patent No.: US 10,347,591 B2
(45) Date of Patent: Jul. 9, 2019

(54) METALLIC, TUNABLE THIN FILM STRESS COMPENSATION FOR EPITAXIAL WAFERS

(71) Applicant: II-VI OptoElectronic Devices, Inc., Warren, NJ (US)

(72) Inventors: Jeffrey Bellotti, Warren, NJ (US); Mohsen Shokrani, Green Brook, NJ (US)

(73) Assignee: II-VI DELAWARE, INC., Wilmington, DE (US)

( * ) Notice: Subject to any disclaimer, the term of this patent is extended or adjusted under 35 U.S.C. 154(b) by 0 days.

(21) Appl. No.: 15/703,253

(22) Filed: Sep. 13, 2017

(65) Prior Publication Data
US 2018/0082960 A1 Mar. 22, 2018

Related U.S. Application Data

(60) Provisional application No. 62/395,830, filed on Sep. 16, 2016.

(51) Int. Cl.
| | |
|---|---|
| *H01L 21/02* | (2006.01) |
| *H01L 23/00* | (2006.01) |
| *H01L 21/302* | (2006.01) |
| *H01L 21/3205* | (2006.01) |

(52) U.S. Cl.
CPC ...... *H01L 23/562* (2013.01); *H01L 21/02002* (2013.01); *H01L 21/02395* (2013.01); *H01L 21/02658* (2013.01); *H01L 21/302* (2013.01); *H01L 21/32051* (2013.01)

(58) Field of Classification Search
CPC ............. H01L 23/562; H01L 21/02002; H01L 21/02658; H01L 21/302; H01L 21/02395; H01L 21/32051; C30B 25/02
See application file for complete search history.

(56) References Cited

U.S. PATENT DOCUMENTS

| | | | |
|---|---|---|---|
| 5,578,521 A | * 11/1996 | Suzuki | C23C 16/45561 117/94 |
| 5,834,363 A | * 11/1998 | Masanori | H01L 21/0214 438/507 |
| 7,198,671 B2 | 4/2007 | Ueda | |

(Continued)

FOREIGN PATENT DOCUMENTS

| | | |
|---|---|---|
| JP | 2013-201397 | 10/2013 |
| KR | 10-2012-0007394 | 1/2012 |

*Primary Examiner* — Jasmine J Clark
(74) *Attorney, Agent, or Firm* — Wendy W. Koba

(57) ABSTRACT

A metallic, stress-tunable thin film structure is applied to the backside of an epitaxial wafer to compensate for stress created by the frontside epitaxial layers. The structure may comprise multiple layers, including a metallic stress compensation layer ("SCL"), a metallic adhesive layer and/or a passivation (or solder attach) layer. In other embodiments, the stress compensation structure comprises only the metallic stress compensation layer. In a first application, the metallic stress compensation structure is applied to a backside of an epitaxial wafer prior to beginning device fabrication, correcting for bow present in as-purchased wafers. In a second application, the metallic stress compensation structure is applied to a backside of a thinned epitaxial wafer at the completion of frontside processing, preventing bow-induced wafer breakage upon removal from the rigid support structure or carrier disc.

29 Claims, 11 Drawing Sheets

(56) References Cited

U.S. PATENT DOCUMENTS

| | | |
|---|---|---|
| 7,727,785 B2 | 6/2010 | Connell et al. |
| 7,825,417 B2 | 11/2010 | Sakai et al. |
| 8,785,305 B2 | 7/2014 | Ramdani |
| 9,184,041 B2 | 11/2015 | Chen et al. |
| 2005/0110040 A1 | 5/2005 | Peng |
| 2011/0260258 A1 | 10/2011 | Zhu et al. |
| 2014/0225231 A1 | 8/2014 | Gambino et al. |
| 2015/0255955 A1* | 9/2015 | Wang .................... H01S 5/0224 438/29 |

* cited by examiner

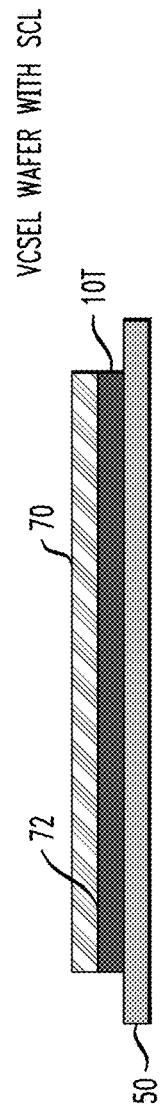
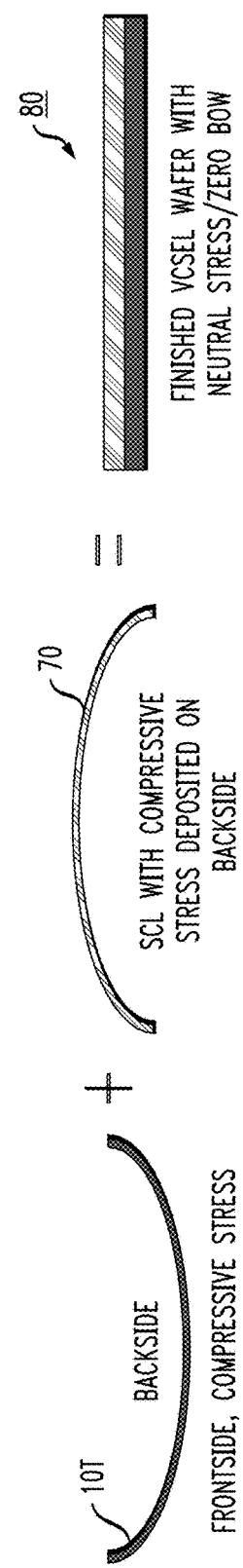
FIG. 7
FIG. 8

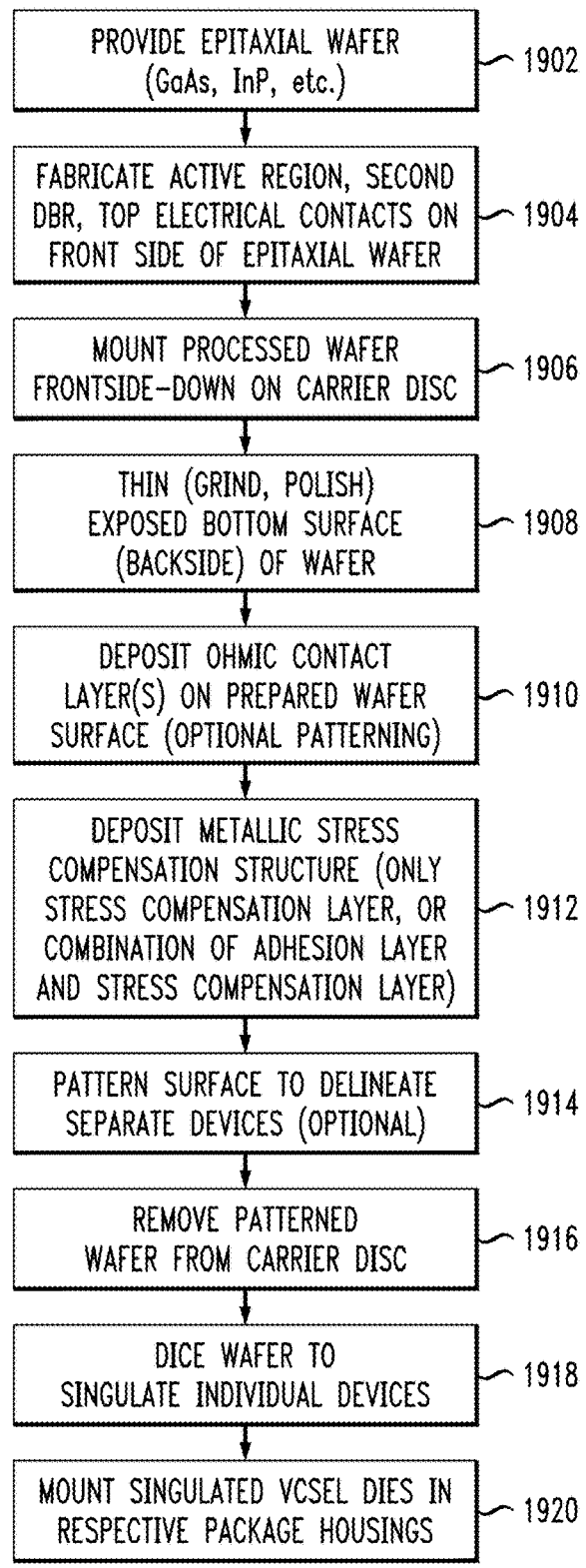

METALLIC, TUNABLE THIN FILM STRESS COMPENSATION FOR EPITAXIAL WAFERS

CROSS-REFERENCE TO RELATED APPLICATIONS

This application claims the benefit of U.S. Provisional Application Ser. No. 62/395,830, filed Sep. 16, 2016 and herein incorporated by reference.

BACKGROUND OF THE INVENTION

Many types of semiconductor devices are fabricated on epitaxial wafers (also known in the industry as "epi" wafers) that contain materially complex, multiple epitaxial layers deposited across a wafer of a desired substrate material. The process of depositing these epitaxial layers, as well as the microstructure of the layers themselves, unavoidably contributes large intrinsic tensile or compressive stresses that produce large physical distortions to the wafer flatness. These distortions are generally known as bow and warp. By their specific American Society for Testing and Materials (ASTM) definitions, "bow" is quantified as the "deviation of the center point of the median surface of a free-unclamped wafer from the median surface reference plane established by three points equally spaced on a circle with a diameter a specified amount less than the nominal diameter of the wafer", "warp" is quantified as the "difference between the maximum and minimum distances of the median surface of a free, unclamped wafer from a reference plane." For the sake of convenience, the following discussion refers to a distortion to wafer flatness in the most general sense as "bow."

Wafer bow often involves more than one of the following root causes: crystallographic lattice mismatch strain between adjacent epitaxial layers; epitaxial microstructure; thermal stress (coefficient of thermal expansion (CTE) mismatch) from the growth processes or high-temperature processing of the epitaxial wafer (e.g., thermal anneal); and additive or subtractive processing of the epitaxial layers during the manufacturing process.

Wafer bow in excess of tens of microns ($\mu$m) can negatively impact wafer processing in terms of breakage of wafers. Wafer breakage in semiconductor manufacturing is expensive, as individual wafers contain thousands, or tens of thousands, of product die. The loss of wafers in the manufacturing process due to excessive wafer bow can shut down tools, contaminate equipment, delay shipment schedules, and cost the manufacturer thousands of dollars per wafer.

The presence of bow in "as-purchased" epitaxial wafers prior to beginning any device fabrication can affect the performance of various wafer fabrication tools, such as those used for photolithography, resulting in improper device with critical dimensions that do not meet specifications. Wafer bow values of hundreds of microns or even millimeters make processing very difficult, if not impossible.

The problem of wafer bow becomes greater as the size of the epitaxial wafer increases. Modern gallium arsenide (GaAs) wafer fabrication factories process 6-inch (150 mm) diameter epitaxial wafers, as compared to older, prior art 3-inch (75 mm) and 4-inch (100 mm) wafer sizes.

At the start of wafer processing, wafer bow can be reduced by adding a thick layer of silicon nitride or silicon dioxide to the backside of the epitaxial wafer. However, the formation of this type of dielectric layer requires a relatively high process temperature (e.g., 400° C.), which may result in undesirable modifications of the surface (or sub-surface) epitaxial layers in a pre-processed epitaxial wafer. For example, the stoichiometry of the GaAs may be altered as some of the arsenic (As) present at the surface starts to evaporate when subjected to elevated temperatures for extended periods of time. Additionally, the frontside of the wafer may be contaminated as it comes into direct physical contact with the platen fixtures inside the dielectric deposition tools. As a result, further processing of the surface may be required (e.g., wet cleaning, wet etching, or the like) to ensure that a pristine surface free of damage, impurities, and particles is presented for subsequent device fabrication steps.

Use of stress-controlling dielectrics with post-process, thinned wafers is also of limited value, since the backside of an epitaxial wafer is typically metalized to form an electrical contact to the devices formed on the frontside of the wafer. Adding an insulating layer such as silicon nitride or silicon oxide will therefore interfere with the metal contact layer, making such an approach to wafer bow reduction impractical. Further, the insulator layers are brittle and tend to be relatively thick (up to microns in thickness) and are known to flake and peel off of the backside of the wafer, especially at the wafer edge, resulting in particles that may contaminate wafer frontside processing and interfere with the formation of defect-free devices.

SUMMARY OF THE INVENTION

The present invention addresses the issue of wafer bow through the application of a metallic, stress-tunable thin film structure that is applied to the backside of an epitaxial wafer. In some embodiments, the stack comprises multiple layers including a metallic stress compensation layer ("SCL"), an adhesive layer and/or a cap layer. In other embodiments, the compensation structure comprises only the metallic stress compensation layer. In a first application, the metallic stress compensation structure is applied to a backside of an epitaxial wafer prior to beginning device fabrication, correcting for bow present in as-purchased wafers (referred to as "pre-process" compensation). In a second application, the metallic stress compensation structure is applied to the backside of a thinned epitaxial wafer (after completion of frontside processing and backside wafer thinning), preventing bow-induced wafer breakage upon removal of the wafer from the rigid carrier disc used to support the thinned wafer during backside processing.

In one embodiment, the present invention takes the form of a stress-compensated epitaxial wafer including a semiconductor substrate (having first and second opposing major surfaces), a plurality of epitaxial layers of alternating (or variable) composition formed on the first major surface of the substrate (that produce significant intrinsic stress within the wafer), and a metallic stress compensation structure deposited on the second, opposing major surface of the pre-processed, full-thickness substrate or the post-processed, thinned substrate. In accordance with the principles of the present invention, the bowing in the wafer attributed to the stress created by the plurality of epitaxial layers is substantially offset by one or more controllable characteristics of the metallic stress compensation structure.

Another specific embodiment of the present invention relates to a method of forming a stress-compensated pre-process epitaxial wafer by: obtaining a semiconductor substrate having a plurality of epitaxial layers of alternating (or variable) composition formed on a top major surface (frontside) thereof; measuring a wafer bow associated with the presence of the plurality of epitaxial layers; and depositing a metallic stress compensation structure on an opposing, bottom major surface (backside) of the semiconductor substrate. A defined thickness of the metallic stress compensation structure is deposited to sufficiently compensate for the wafer bow to form an essentially flat, stress-compensated epitaxial wafer.

Yet another specific embodiment of the present invention defines a method of minimizing wafer bow in thinned, post-process epitaxial wafers. In this embodiment, the method comprises the steps of: providing a thinned epitaxial wafer mounted frontside-down on a rigid carrier disc or other support structure (exposing a bottom substrate surface (backside) of the thinned epitaxial wafer); depositing a metallic stress compensation structure over the backside surface, either before or after any other metallization on this surface that may be required for an electrical contact, while controlling parameters of the deposited metallic stress compensation structure to compensate for wafer bow; and, finally, demounting the thinned epitaxial wafer from the carrier or support structure.

Other and further embodiments of the present invention will become apparent during the course of the following discussion and by reference to the accompanying drawings.

BRIEF DESCRIPTION OF THE DRAWINGS

Referring now to the drawings,

FIG. 7 depicts a thinned epitaxial wafer as mounted upside-down on a carrier disc, with a metallic stress compensation layer formed in accordance with the present invention disposed to cover the exposed backside surface of the thinned epitaxial wafer;

FIG. 8 is a simplified diagram illustrating the concept of post-process stress compensation;

FIG. 19 is a flowchart of an exemplary process of forming a post-process metallic stress compensation structure in accordance with the teachings of the present invention.

DETAILED DESCRIPTION

In order to successfully process epitaxial wafers from start to finish, the issue of wafer bow must be dealt with as the wafer makes its way through dozens of process steps in the manufacturing line. In some cases, the initial bow present in purchased epitaxial wafers (hereinafter referred to as "pre-process" bow) may need to be corrected so that the wafer can be used with standard tools and achieve acceptable results. In other cases, a bow remaining after frontside process of epitaxial wafers needs to be minimized to prevent breakage during subsequent handling (referred to hereinafter as "post-process" bow).

In particular, after frontside processing is complete, the wafers are flipped and the frontside is adhesive-mounted to a rigid carrier disc for wafer thinning and other backside operations (such as ohmic contact metallization). After the conventional backside processing steps are completed, the wafers are demounted from the carriers leaving an unconstrained, fragile, thinned wafer with very large wafer bow (perhaps up to approximately 20 millimeters (mm)). The excessive wafer bow in these thin, fragile wafers commonly leads to breakage during the demount operation, or during the steps immediately following the demount process (e.g., frame mounting or device testing). The breakage rate can be very high, especially for wafer diameters of 150 mm (6 inches) which makes it difficult and uneconomical to manufacture devices such as Vertical Cavity Surface Emitting Lasers (VCSELs) at high volume.

Various embodiments of the inventive metallic stress compensation structure may be used to modify the wafer bow present in as-purchased epitaxial wafers (i.e., compensate "pre-process" wafer bow) or used to modify the wafer bow present in epitaxial wafers subsequent to frontside device fabrication and substrate thinning operations (i.e., compensate "post-process" wafer bow). Both pre-process and post-process epitaxial wafer bow compensation are described in detail below.

With reference to pre-process bow, it is well-known that the multiple epitaxial layers grown (or deposited) on a semiconductor substrate contribute large intrinsic tensile or compressive stresses that produce large physical distortions to wafer flatness, creating the undesirable wafer bow. Some of the standard tools used in the fabrication of semiconductor devices cannot process wafers that exhibit large wafer bow. Even in situations where the tools are able to process the bowed wafers, an excessive amount of bow may result in mis-alignment in the features fabricated across the surface of the wafer. If sufficiently mis-aligned, the entire wafer must be scrapped.

Figure 1:
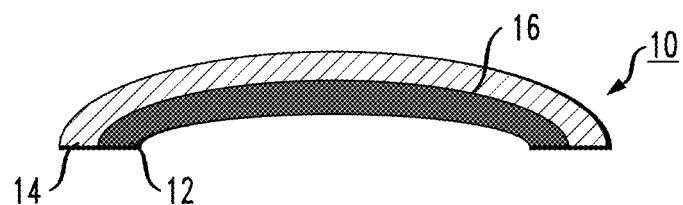
FIG. 1 depicts a conventional, as-purchased epitaxial wafer, showing the bow present in this pre-process wafer.
Figure 2:
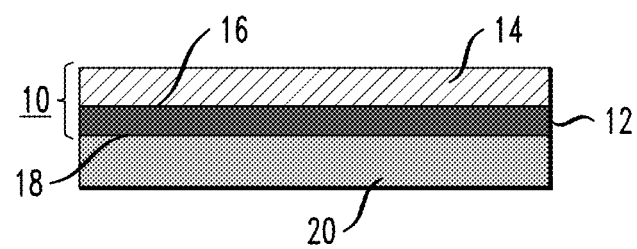
FIG. 2 shows an exemplary pre-process metallic stress compensation layer applied to the backside of the epitaxial wafer of FIG. 1.

FIG. 1 is a simplified depiction of a pre-process epitaxial wafer 10, illustrating a curvature (bow) across the diameter of the wafer. Epitaxial wafer 10 comprises a substrate 12 and a plurality of thin epitaxial layers 14 that are grown/deposited on a frontside 16 of substrate 12. As described above, the differences in structure between adjacent epitaxial layers (which may comprise alternating (or variable composition) layers of GaAs and AlGaAs, InGaAs or GaN and AlGaN, for example) gives rise to the presence of wafer bow. In accordance with one or more embodiments of the present invention, the amount of bow is reduced by forming a metallic (i.e., a metal or metal alloy) stress compensation layer 20, as shown in FIG. 2, across a backside 18 of wafer 10 prior to initiating a conventional device fabrication sequence. In most cases, substrate 12 comprises either GaAs or InP, with the appropriate types of epitaxial layers formed on a major surface of the substrate. While the following discussion may at times refer to a GaAs substrate, or epitaxial layers formed of GaAs/AlGaAs, it is to be understood that the inventive concept of providing wafer bow compensation using a metallic thin film structure is equally applicable to use with an InP, Si, or SiC substrate, or a semiconductor substrate of any other material that may be subjected to compressive/tensile stresses from layers formed over the surface.

In one or more embodiments of the present invention, metallic stress compensation layer 20 is applied using a relatively low temperature (e.g., about 100-150° C.), controllable process (such as a sputter deposition process) so that the amount of created stress across backside 18 can be managed to essentially compensate for the intrinsic stress present in pre-process epitaxial wafer 10 and thus minimize wafer bow. The use of a relatively low temperature deposition process prevents the opportunity for stoichiometric changes or other damage to occur in epitaxial layers 14, as discussed above. Additionally, the use of a relatively low temperature deposition process for the metallic stress compensation layer will not disrupt the conventional process flow in the manner that high temperature processes used to form dielectric compensation layers were known to do (e.g., process delay in ramping up temperature of equipment to that required for high-stress dielectric deposition, and then another process delay in allowing equipment to cool down to device fabrication temperature subsequent to dielectric deposition).

Figure 3:
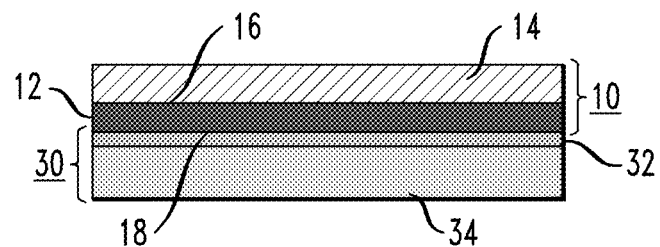
FIG. 3 illustrates an alternative pre-process metallic stress compensation structure formed in accordance with the present invention, where in this embodiment the structure includes a metallic adhesion layer (bonded to the backside of the epitaxial wafer) and a metallic stress compensation layer deposited over the metallic adhesion layer.

FIG. 3 illustrates an alternative embodiment of a metallic stress compensation structure as used with a pre-process epitaxial wafer in accordance with one or more embodiments of the present invention. In this case, metallic stress compensation structure 30 comprises an initial metallic adhesion layer 32 deposited over backside 18 of wafer 10, with a metallic stress compensation layer 34 deposited over metallic adhesion layer 32. In one or more embodiments, adhesion layer 32 may comprise a metal (for example, Ti, Cr, or Ta) and stress compensation layer 34 may comprise a compatible metal or metallic alloy (for example, TiW or TaW).

In accordance with various aspects of these pre-process embodiments of the present invention, the thicknesses of adhesion layer 32 and stress compensation layer 34 may be controlled to provide the desired degree of stress compensation (and, therefore, wafer bow reduction) so that epitaxial wafers can be processed in standard tools. That is, providing a "tunable" stress state. Besides controlling the thickness of the deposited metallic stress compensation layer, the amount of intrinsic stress created in structure 30 may be controlled by modifying one or more deposition process parameters. When using a conventional sputter deposition process, these parameters may include, but are not limited to, deposition chamber pressure, target power, and separation distance between the target source and the wafer surface.

Figure 4:
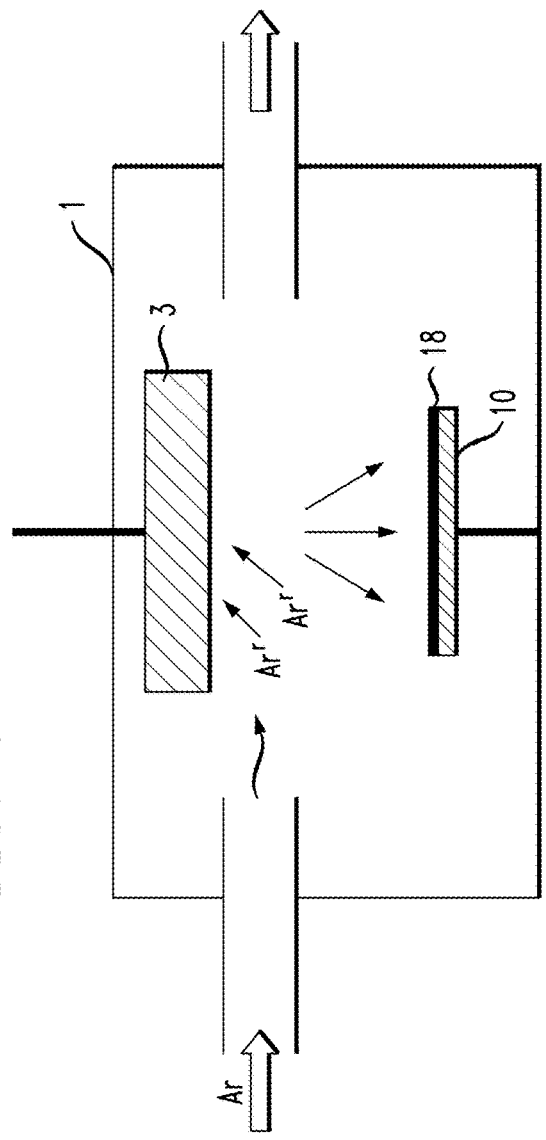
FIG. 4 is a simplified block diagram of an exemplary sputter deposition apparatus that may be used in the process of applying the metallic stress compensation structure to an epitaxial wafer.

FIG. 4 is a simplified block diagram of a conventional, prior art sputter deposition chamber 1, used to deposit a layer of material on an exposed wafer surface. For the purposes of use with the present invention, an epitaxial wafer 10 is shown as placed within chamber 1, with backside 18 of wafer 10 exposed for processing. Also positioned in chamber 1 is a target 3, which comprises a solid block (for example) of the material that is to be deposited onto backside 18 of wafer 10. Chamber 1 is evacuated to a predetermined pressure (typically in the range of 1-20 mTorr), and an inert gas (typically, argon (Ar)) is directed into chamber 1 through an inlet 4, where the gas is ionized and accelerated toward target 3. The $Ar^+$ ions bombard target 3, releasing atoms of the target material which are then directed downward and onto backside 18 of wafer 10. As mentioned above, the parameters which may be adjusted to tune the amount of stress created within the deposited layer include the pressure within the chamber, the power applied to the target (energy of the sputtered atoms projected toward the wafer surface), and the separation between the target and the wafer.

An exemplary configuration of a pre-process stress compensation structure 30 includes a Ti adhesion layer 32 with a thickness on the order of 500-1000 Å, and a TiW stress compensation layer 34 with a thickness on the order of 1000-5000 Å.

Once a sufficient thickness of the stress compensation layer has been applied to backside 18 of wafer 10 ("sufficient" being a thickness that provides for a defined amount of stress compensation to create a wafer with a flatness acceptable for further processing), wafer 1 can start processing in the first of many fabrication tools to begin the actual process of forming semiconductor devices over epitaxial layers 14.

It is to be understood that in association with the pre-process stress compensation structures and methods of the present invention, the compensation structure itself is preferably removed from backside 18 of wafer 10 once the frontside device fabrication process is completed. The pre-process stress compensation structure is typically defined as a "sacrificial" structure in the art, used for the purposes of controlling a portion of the fabrication process but not forming part of the final device structure. In particular, once the frontside fabrication process is completed, the finished wafer is mounted "upside down" (i.e., frontside down) on a support fixture (referred to hereinafter as a "carrier disc"), and the stress compensation structure is removed by grinding or polishing. Following the removal of the stress compensation structure, a significant thickness of substrate 12 may also be removed (often referred to in the art as a "wafer-thinning" process). The remaining structure (referred to hereinafter as "thinned wafer 10T") may then continue backside processing or be demounted from the carrier disc and diced into separate, individual components.

Figure 5:
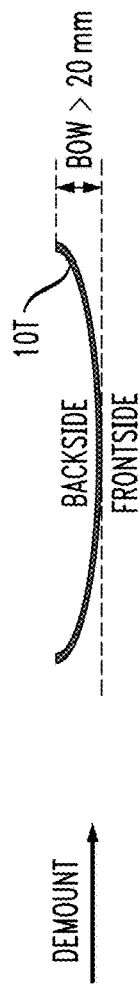
FIG. 5 depicts a post-process, thinned epitaxial wafer as mounted on a carrier disc.
Figure 6:
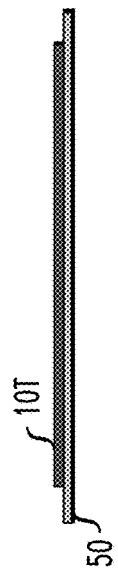
FIG. 6 depicts the thinned epitaxial wafer of FIG. 4 subsequent to being demounted from the carrier disc, illustrating the presence of wafer bow.

As mentioned above, when a conventional post-process wafer is removed from a carrier disc after wafer thinning, the initial stresses associated with epitaxial layers 14 will no longer be constrained and the wafer will immediately spring back into its bowed form. Moreover, the removal of a portion of substrate 12 may further contribute to the stress state and increase wafer bow. FIG. 5 depicts a thinned wafer 10T as attached to a carrier disc 50, and FIG. 6 depicts thinned wafer 10T after it has been removed ("demounted") from carrier disc 50. The bow across wafer 10T may be on the order of 20 millimeters (mm) or more (measured in accordance with the ASTM standard definition, mentioned above).

A post-process metallic stress compensation layer is proposed, in accordance with one or more embodiments of the present invention, to be formed on the backside of the thinned wafer (or on top of an ohmic contact layer formed on the backside of the thinned wafer) prior to removing the thinned wafer from the carrier disc. As with the pre-process structure, the various parameters of the post-process metallic stress compensation structure may be controlled to reduce the amount of intrinsic stress within the processed wafer, allowing for the wafer to be safely removed from the carrier disc without breaking, while also maintaining a relatively flat form. Said another way, by adding the inventive metallic stress compensation structure to the backside of a thinned epitaxial wafer, it is now possible to essentially eliminate the bow which otherwise would re-appear when the thinned wafer is removed from the carrier disc (the re-activation of this bow inevitably causing breakage in a large fraction of fabricated wafers).

FIG. 7 illustrates thinned wafer 10T as still mounted frontside-down on carrier disc 50, as described above. In accordance with the post-process embodiments of the present invention, a metallic stress compensation layer 70 is formed on an exposed surface 72 of thinned wafer 10T. As will be discussed below in association with FIG. 10, an ohmic contact layer is formed on thinned wafer 10T prior to depositing stress compensation layer 70. In other embodiments, stress compensation layer 70 is directly deposited on exposed surface 72 of thinned wafer 10T. The deposition process for stress compensation layer 70 is controlled in accordance with the principles of the present invention so as to create an amount of stress sufficient to compensate for the intrinsic stress remaining within thinned wafer 10T.

FIG. 8 is a simplified diagram illustrating the concept of post-process stress compensation, showing in this case a frontside compressive stress exhibited by thinned wafer 10T being "added to" a backside compressive stress created by metallic stress compensation layer 70 to yield an "essentially flat" wafer configuration 80. Essentially flat is defined as exhibiting neutral stress, with little to no wafer bow. In accordance with one or more embodiments of the present invention, wafer configuration 80 remains substantially flat when demounted from carrier disc 50.

Stress compensation layer 70 can be made of a metal alloy such as titanium-tungsten (TiW) or tantalum-tungsten (TaW), as well as any similar metal alloy (e.g., NiV, NiAl, NiTi, NiCrMo, CoCr, TaAl, TaTi, MoAl, MoCr, MoTi, etc.). Conductive nitrides or silicides of these metal alloys are also suitable choices to form a metallic stress compensation layer in accordance with one or more embodiments of the present invention. Metals with a high elastic (Young's) modulus greater than about 200 GPa are ideal for the stress compensation layer, but even those with an elastic modulus as low as 100 GPa may be used. Examples of potential metal (elemental) stress compensation layers include Be, Ti, Cr, Fe, Co, Ni, Cu, Mo, Ru, Rh, Pd, Ta, W, Re, Ir, and Pt. An exemplary metallic stress compensation structure formed in accordance with one or more embodiments of the present invention can take the form of a single layer (e.g., TiW or Ta), or a multilayer configuration of different metals or elements (e.g., Ti/W/Ti/W) or metal alloys (e.g., TiW/TiWN/TiW/TiWN), or some combination of the two (e.g., TiW/W/TiW/W).

Figure 9:
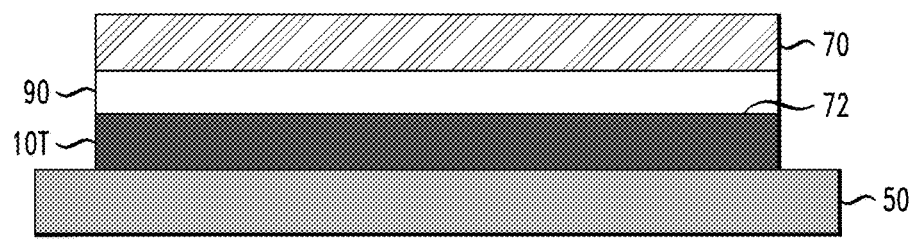
FIG. 9 illustrates an alternative post-process embodiment of the present invention, where in this case the metallic stress compensation structure comprises a metallic adhesion layer bonded to the exposed backside wafer surface, and a metallic stress compensation layer deposited over the metallic adhesion layer.

In some specific post-process embodiments of the present invention, the metallic stress compensation structure comprises at least two separate layers, a metallic adhesion layer and a metallic stress compensation layer (the latter being either a single layer, or a multilayer configuration). The adhesion layer is used to ensure that the stress compensation layer is strongly bonded to the backside of the wafer (or to an ohmic contact layer formed on the backside of the wafer). FIG. 9 illustrates an exemplary embodiment using an adhesion layer 90 interposed between exposed surface 72 of thinned wafer 10T and stress compensation layer 70. Adhesion layer 90 may comprise Ti, Ta, Cr, or any other metal or metal alloy that strongly bonds to the substrate material of thinned wafer 10T.

Figure 10:
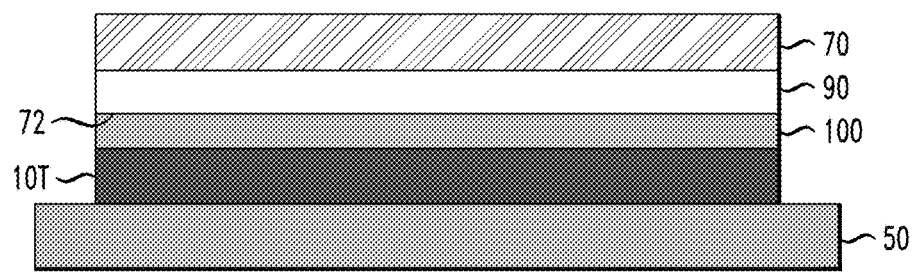
FIG. 10 illustrates another post-process embodiment of the present invention, in this case where an ohmic contact is formed on the backside of the wafer prior to forming the metallic stress compensation structure (which is deposited over the ohmic contact 0.

As mentioned above, there are many situations where an electrical contact, such as a metallic ohmic contact thin film stack, needs to be formed on the backside of an epitaxial wafer prior to adding a metallic stress compensation structure. FIG. 10 illustrates one such configuration, where in this case a metallic ohmic contact 100 is illustrated as formed over the thin, polished exposed surface 72 of thinned wafer 10T. This is often referred to in the art as an "ohmic contact", since a metal layer is deposited to directly contact a layer of semiconductor material (i.e., thinned wafer 10T). Ohmic contact 100 may comprise a set of separate layers, usually a Au—Ge based "stack" of layers. Once ohmic contact 100 is deposited, stress compensation layer 70 is deposited across the exposed surface 100-S of contact 100. When using a separate adhesion layer, it is to be understood that the adhesion layer is first deposited over contact 100 (shown in phantom as adhesion layer 90 in FIG. 10), with stress compensation layer 70 then deposited over adhesion layer 90.

Figure 11:
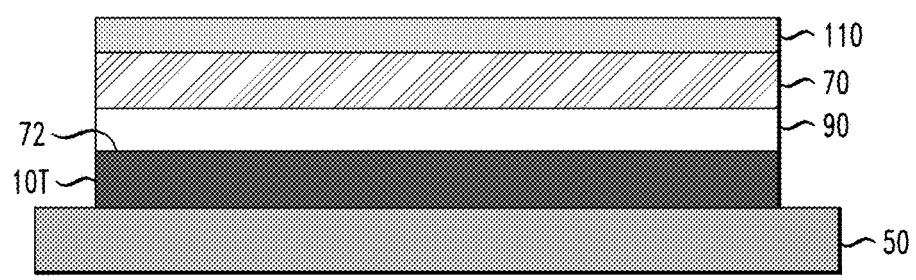
FIG. 11 illustrates another post-process embodiment of the present invention, where in this case including an outer passivation layer (to prevent oxidation) disposed to cover and protect the metallic stress compensation layer.

In other post-process embodiments of the present invention, a passivation layer is deposited over the exposed surface 74 of metallic stress compensation layer 70. FIG. 11 illustrates an exemplary passivation layer 110 disposed over metallic stress compensation layer 70. Similar to the use of passivation layers with various other semiconductor structures, layer 110 serves as an outer coating/protection layer that prevents oxidation of the underlying material. Passivation layer 110 is typically formed of a "noble metal" (e.g., Au, Ag, Cu, Pd, or Pt). In this particular embodiment, adhesion layer 90 is also present. It is to be understood that the inclusion of an adhesion layer with a passivation layer is optional. Additionally, it is understood a passivation layer may be used in a configuration that also includes an ohmic contact 100, as shown in FIG. 10.

Figure 12:
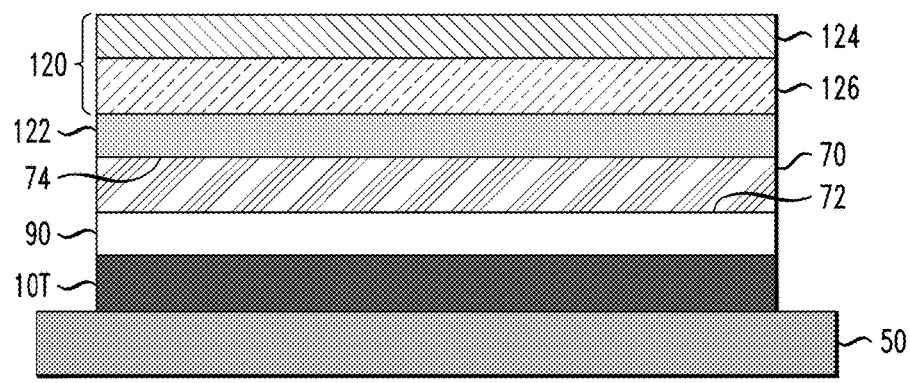
FIG. 12 illustrates yet another post-process embodiment of the present invention, where in this case a solder attachment thin film stack or structure is disposed over the metallic stress compensation layer, simplifying the later process of attaching the individual die (singulated from the wafer) to integrated circuit packaging.

Instead of, or in addition to, a passivation layer, a solder attach thin film stack or structure may be formed over the exposed surface of metallic stress compensation layer 70. FIG. 12 illustrates an exemplary solder attach structure 120 as formed over exposed surface 74 of metallic stress compensation layer 70. As will be discussed below, a solder attach structure is typically used when the individual components (after being diced apart from the wafer form) are to be housed within an integrated circuit package. In the specific embodiment shown in FIG. 12, solder attach structure 120 includes an adhesion layer 122 of a material (for example, Ti) that is well-suited for adhering to metallic stress compensation layer 70. A solder layer 124 (formed of Au, for example) is disposed on as the top layer on structure 120, with an intermediate barrier layer 126 (formed of Pt, for example) disposed between adhesion layer 122 and solder layer 124. When solder layer 124 later comes into contact with the actual material used to solder the device in place (typically, Au—Sn solder), barrier layer 126 prevents the liquefied solder materials from migrating into the layers forming the actual device (in this case, the metallic stress compensation structure).

It is to be understood that the stress amounts of adhesion layer 90, ohmic contact 100, passivation layer 110, and solder attachment structure 120, when present, need to be included in the determination of the proper thickness required for stress compensation layer 70 to cancel the intrinsic stress present in thinned wafer 10T. Additionally, prior to wafer demount, the backside metal stack comprising all of the above-described layers may be patterned and etched to form "die streets" to facilitate die singulation at the complication of the device fabrication process.

Figure 13:
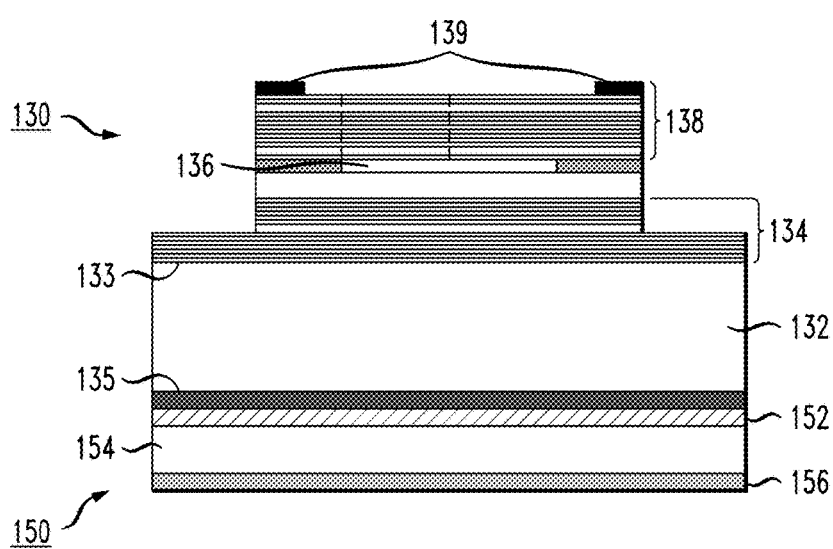
FIG. 13 illustrates an exemplary VCSEL including a metallic stress compensation structure formed in accordance with the present invention.

An example of a technology affected by wafer bow is GaAs-based VCSELs. An exemplary VCSEL 130, as shown in FIG. 13, comprises a GaAs substrate 132, a first distributed Bragg reflector (DBR) 134 formed on a first major surface 133 of substrate 132, an active region 136 formed on first DBR 134, and a second DBR 138 disposed over active region 136. Metal contacts 139 are shown as formed on second DBR 138. Both first DBR 134 and second DBR 128 comprise numerous, epitaxially grown layers of alternating material compositions (e.g. GaAs and AlGaAs) having alternating indices of refraction, each layer having a thickness equal to one-quarter of the wavelength of the light emitted by VCSEL 130. A metal contact layer 140 is formed across exposed backside surface 135 of (thinned) substrate 132 and is used to ultimately provide an electrical connection to first DBR 134. This electrical connection is also referred to in the art as an "ohmic contact", since a metal layer is deposited to directly contact a layer of semiconductor material. In many embodiments, as mentioned above in association with FIG. 10, metal contact layer 140 actually comprises a set of separate layers, usually a Au—Ge based "stack" of layers. As mentioned above and discussed below, the metallic stress compensation structure of the present invention is formed over this metal contact layer 140.

While not explicitly shown in FIG. 13, it is to be understood that an initial "pre-process" epitaxial wafer used to fabricate VCSEL 130 contains the layers used to form first DBR 134 and second DBR 138. For example, an epitaxial wafer may include twenty or more alternating layers of GaAs and AlGaAs that are grown one after the other on exposed surface 133 of GaAs substrate 132. These alternating layers of GaAs and AlGaAs produce significant tensile and/or compressive stresses in the wafer, resulting in significant wafer bow.

Therefore, in accordance with the pre-process embodiments of the present invention, a pre-process stress compensation structure (not shown in FIG. 13) may be formed on the backside surface of substrate 132 and used to reduce wafer bow as the remaining device layers (i.e., active region 136, second DBR 138, metal contacts 139, etc.) are patterned and/or formed on the front side of the wafer.

Once the frontside processing of the VCSEL wafer is completed, the wafer is mounted frontside-down on a carrier disc. If a pre-process stress compensation structure is present, the layer(s) forming the structure are removed. Wet etching and/or simply grinding or polishing processes are typically used to remove these metallic layers. A portion of the exposed substrate is then removed (by grinding, polishing or etching, including chemical mechanical polishing (CMP) processes), with ohmic contact layer 140 then formed on the thinned wafer backside surface.

A post-process metallic stress compensation structure 150 is shown in FIG. 13 as formed over metal ohmic contact layer 140 of VCSEL 130. In this specific embodiment, structure 150 includes an adhesion layer 152 formed of Ti, which is used to provide strong adhesion to metal contact layer 140. A metallic stress compensation layer 154 formed of TiW is deposited over adhesion layer 152. In this particular embodiment, an Au passivation layer 156 formed over TiW stress compensation layer 154. It is to be understood that in many situations Au passivation layer 156 could be replaced by a solder attachment thin film stack or structure, one specific solder film stack comprising a tri-layer configuration of Ti/Pt/Au.

In one or more embodiments of the present invention, the metallic compensation structure may be "stress tunable" by controlling the thickness of the deposited stress compensation structure (of the one or more layers) and/or the process used to deposit the various layers forming the structure. In particular, the characteristics of the metallic stress compensation layer itself (e.g., microstructure, density, crystal size, phase, thickness, etc.), as well as an adhesion layer (if used) may be tuned by controlling the parameters of the process used to deposit these layers. Indeed, the adhesion layer and the metallic stress compensation layer can both be widely tuned to yield stress amounts with a desired magnitude and type (tensile or compressive).

When using a sputter deposition apparatus such as shown in FIG. 4 the stress-tunability of the inventive stress compensation structure may also be controlled by changing the deposition parameters (e.g., power, pressure, target-wafer separation) to properly compensate for the specific stress state of a given epitaxial wafer (either pre-process or post-process epitaxial wafer).

In particular, the stress compensation layer deposition conditions of a DC magnetron sputtering thin film deposition process may be set to provide the desired stress magnitude and type (tensile or compressive) required to compensate for wafer bow. This may be achieved by selecting specific materials for the metallic stress compensation layer (and the adhesion layer, if present) and then configuring (for a given thickness of each layer) the required thin film microstructure of each layer through selection of the appropriate deposition conditions for those layers. As mentioned above, the deposition chamber pressure, target power, and target-to-wafer separation are some exemplary parameters for tuning the stress state when using a sputtering deposition process. In particular, a DC magnetron sputtering deposition process is capable of yielding an exemplary metallic stress compensation thin film structure with a compressive stress in excess of 3 GPa. Indeed, the formation of a very dense, fine-grain microstructure (for creating a large, tailored compressive stress) of the high elastic modulus material selected for the stress compensation layer, in this case the alloy TiW (with a Ti content of 10%), is possible to produce and use in accordance with the present invention. The thickness of the stress compensation layer may be varied in accordance with the present invention to obtain the desired level of wafer bow correction; in some cases, increasing the thickness of the layer will increase the total amount of stress compensation.

Figure 14:
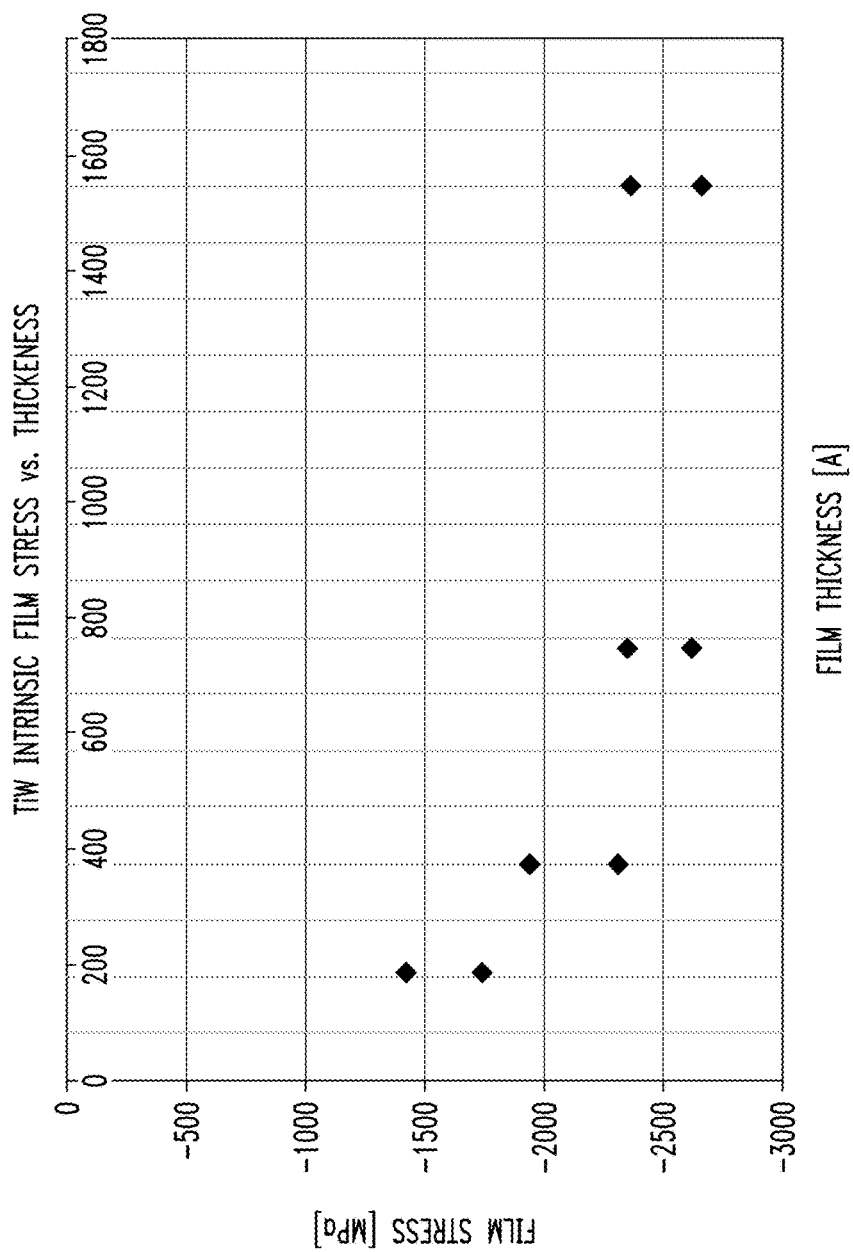
FIG. 14 is a graph of compressive stress as a function of layer or film thickness for a TiW stress compensation layer formed in accordance with the present invention.

The plots depicted in FIGS. 14-18 provide examples of the wide range of tunable stress conditions that can be created within the metallic stress compensation structure of the present invention. FIG. 14 is a plot of the amount of compressive stress for various thicknesses of a TiW stress compensation layer that were sputter-deposited using a DC magnetron sputtering tool at a power level of 2000 W, 40 sccm of Ar at a chamber pressure of 1 mTorr, and a separation of 2.5 cm between a solid TiW target and the backside of the wafer. Under these specific deposition conditions, it is shown that a TiW layer having a thickness of about 200 Å will exhibit a stress of about −1500 MPa (compressive stress). Increasing the thickness of the TiW layer is shown to increase the magnitude of the stress, reaching a value of −2500 MPa for a 1600 Å thick layer of TiW.

In one set of process steps, therefore, it is possible to control the amount of stress created in the metallic stress compensation structure by controlling only the thickness of the deposited layer, leaving the various parameters of the deposition system fixed. However, as mentioned above, it is also possible to control/adjust one or more parameters associated with the deposition process itself to provide stress tunability in accordance with the present invention (of course, both the layer thickness and process parameters may be tuned to modify the magnitude and type of generated stress).

Figure 15:
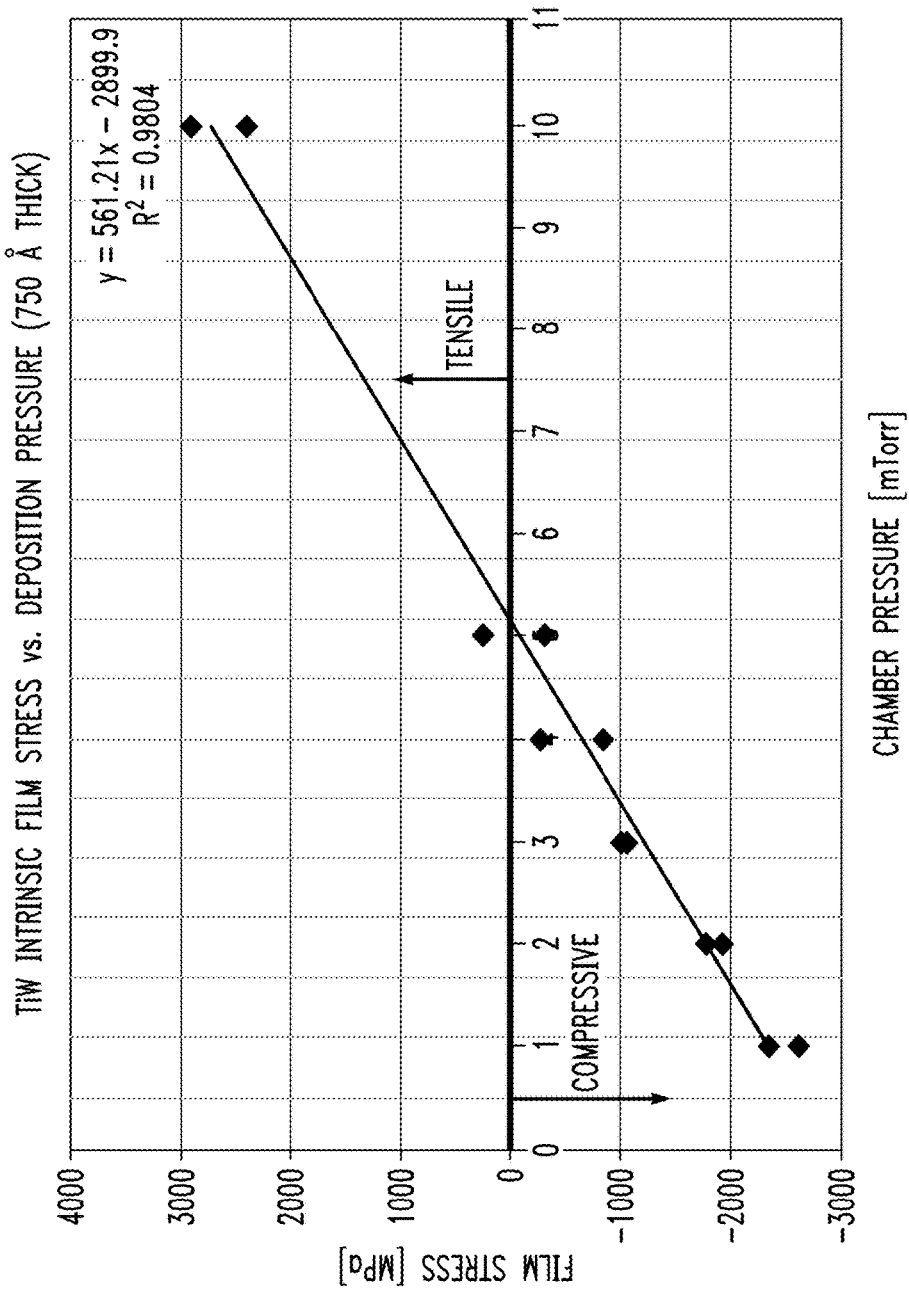
FIG. 15 is a graph of the range of generated stress values (both compressive and tensile) created with a given film thickness of TiW as a function of different chamber pressures used in an exemplary TiW deposition process.

The data in FIG. 15 shows the effect of deposition chamber pressure on the stress state created within a 750 Å thick TiW stress compensation layer. As mentioned above, chamber pressure is one of the variables that can be controlled to tune the created stress condition. Referring to FIG. 15, negative stress values indicate compressive stress, while positive stress values are associated with tensile stress. It is to be understood that these particular stress values are specific to an actual DC magnetron system used to collect the data, and other stress values might be slightly different depending on the chamber geometry and equipment capabilities of the system being employed. For the case of the data displayed in FIG. 15, a 750 Å thick TiW stress compensation layer was sputter-deposited using a DC magnetron sputtering tool operating at a 1000 W power level, 40 sccm of Ar, and a separation of 4 cm between the TiW target and the epitaxial wafer. It is shown that varying the chamber pressure over the range of 1 mTorr to 10 mTorr allows for a wide range of stress states to be achieved, ranging from −2500 MPa (compressive) at 1 mTorr to +3000 MPa (tensile) at 10 mTorr.

Figure 16:
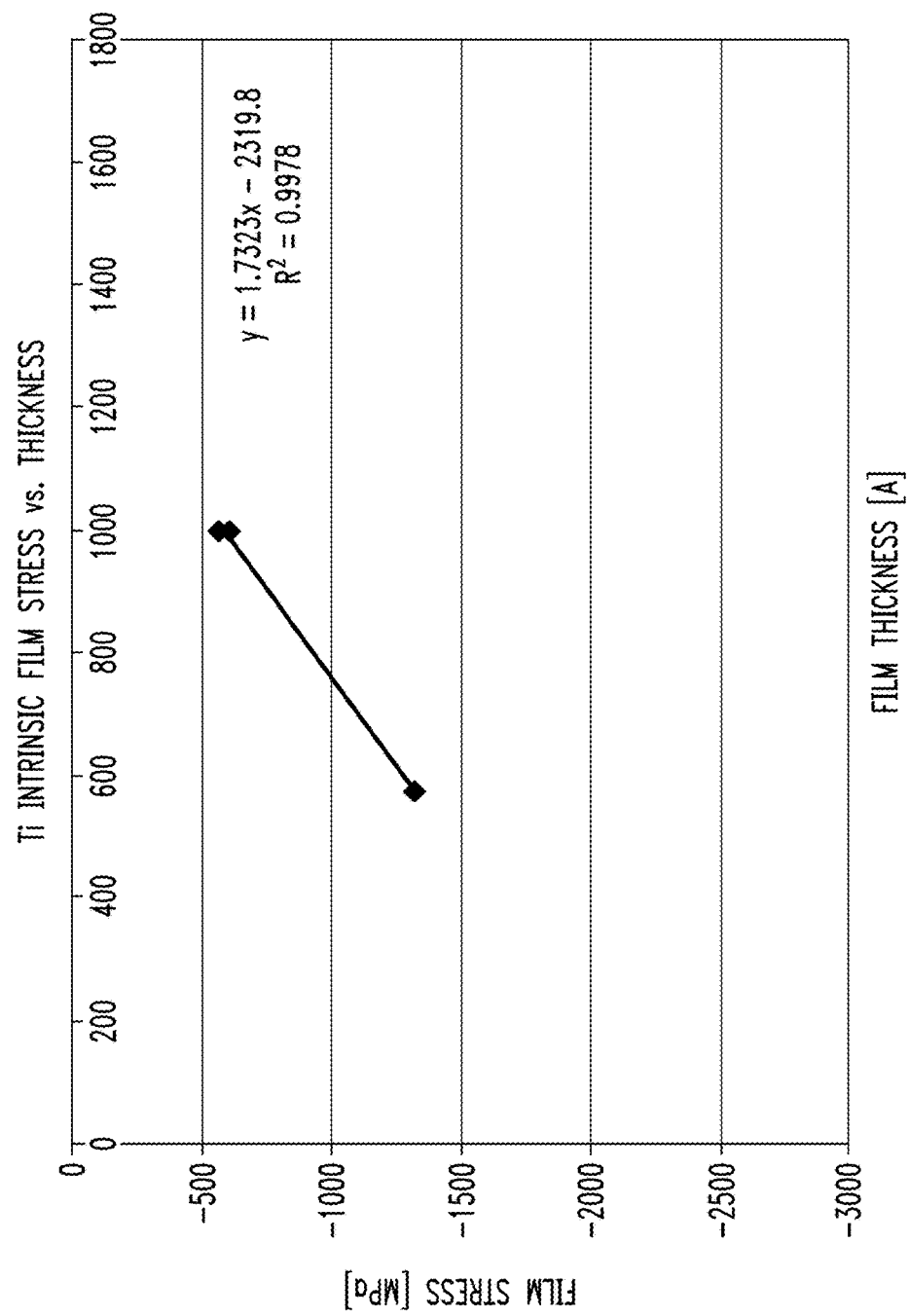
FIG. 16 is a graph of compressive stress as a function of layer or film thickness for a Ti adhesion layer and/or stress compensation layer formed in accordance with the present invention.

FIG. 16 illustrates the stress range for an exemplary Ti stress compensation layer of varying thicknesses deposited in a DC magnetron sputtering tool using a power level of 2000 W, with 40 sccm of Ar at 1.5 mTorr, and a distance of 2.5 cm separating a Ti target and the epitaxial wafer. The stress is shown as being compressive (since deposited at a chamber pressure of 1.5 mTorr), ranging in values from about −1400 MPa for a 400 Å thick film to −600 MPa for a 600 Å thick film.

Figure 17:
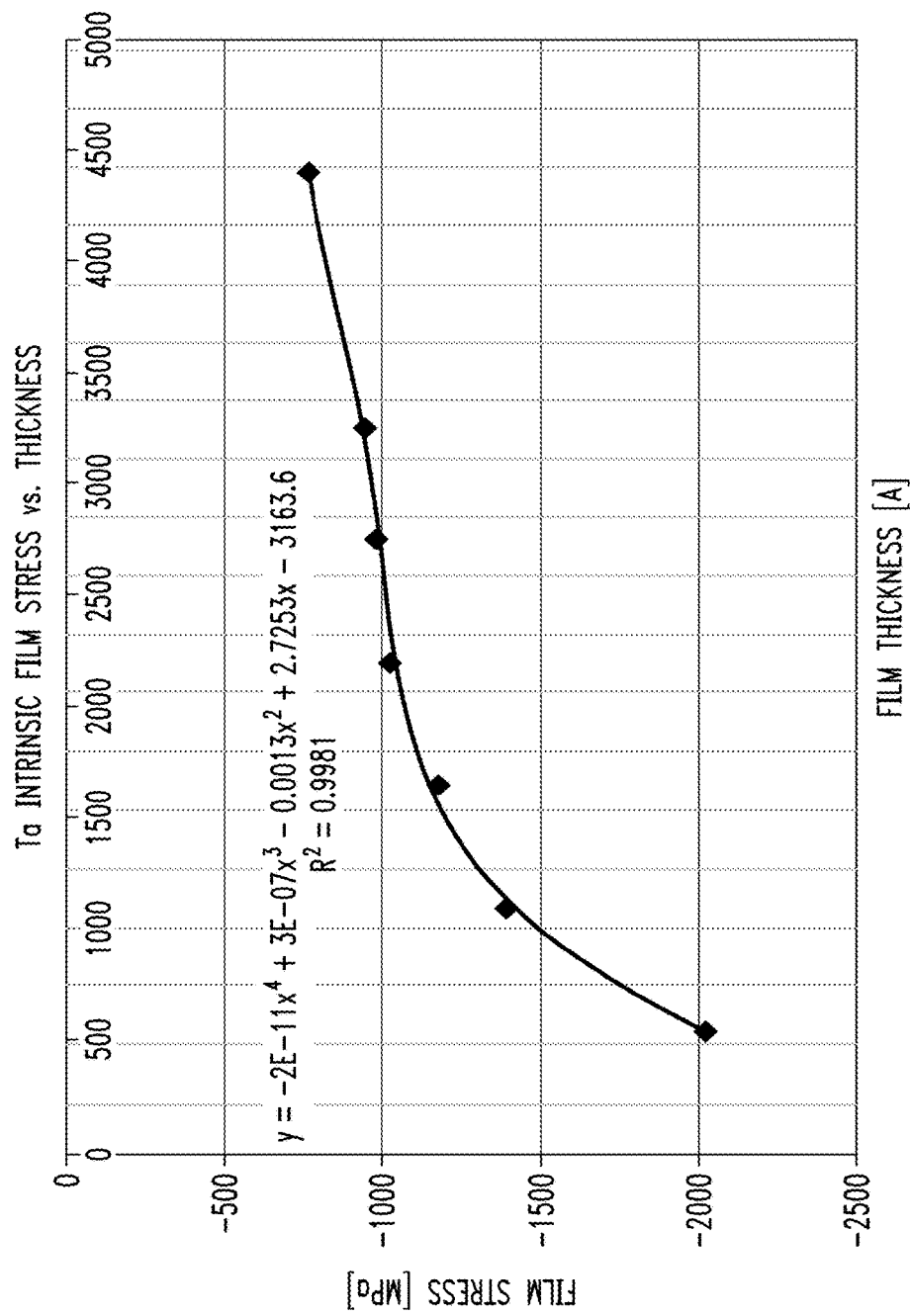
FIG. 17 is a graph of compressive stress as a function of layer or film thickness for a Ta adhesion and/or stress compensation layer formed in accordance with the present invention.

FIG. 17 illustrates an exemplary range of stress values that may be created within a Ta thin film stress compensation layer of varying thicknesses. This data was collected using a DC magnetron sputtering tool at a power level of 2000 W, 40 sccm of Ar at 1.5 mTorr, with a distance of 2.5 cm separating the Ta target from the epitaxial wafer. Similar to the use of TiW layers, the deposition of Ta provides only compressive stress within the given set of parameters, ranging from about −2000 MPa for a thickness of about 500 Å, to about −800 MPa for Ta layer having a thickness of about 4000 Å.

Figure 18:
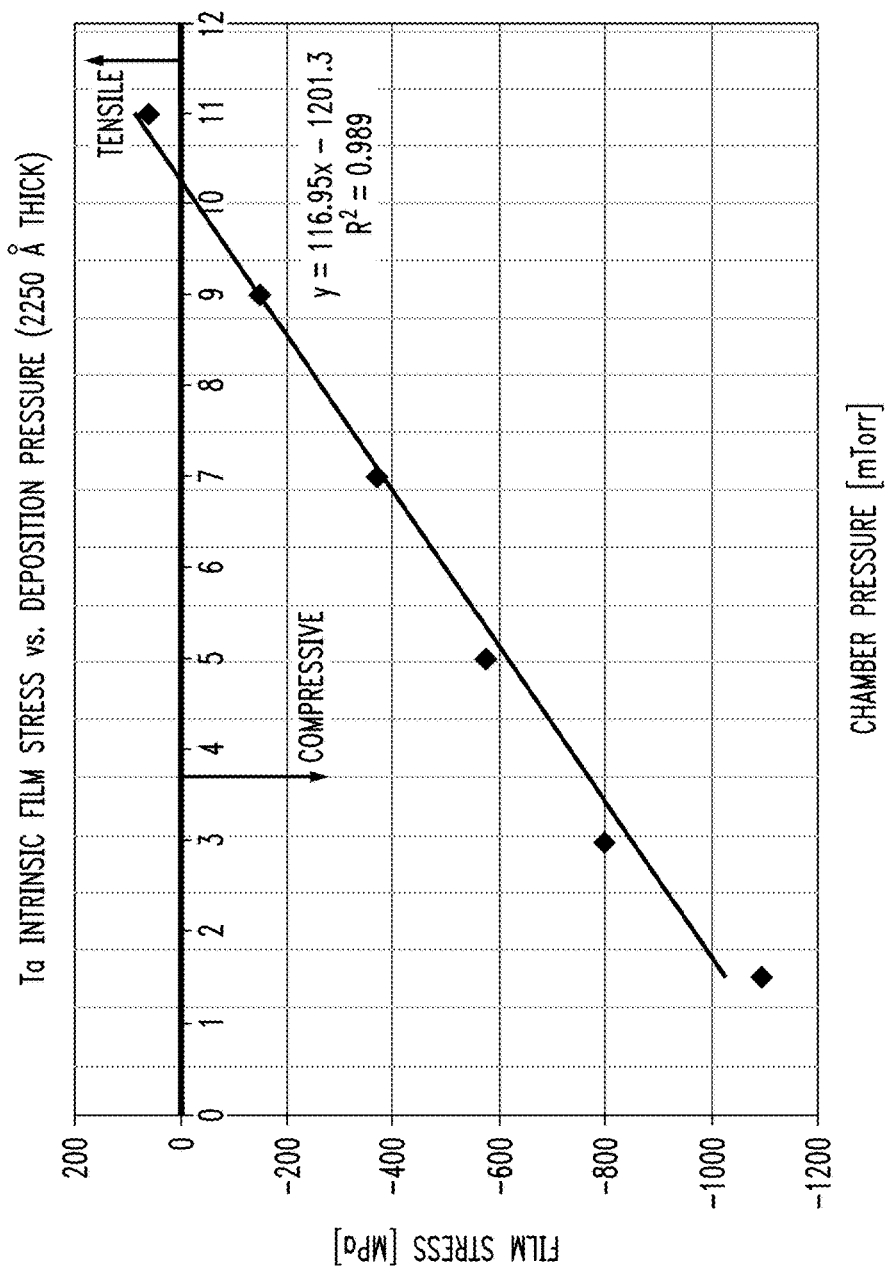
FIG. 18 is a graph of the range of generated stress values (both compressive and tensile) created with a given film thickness of Ta, as a function of the deposition chamber pressures used in an exemplary Ta deposition process.

In the plots of FIG. 18, a 2250 Å thick Ta layer is deposited using a power level of 2000 W, 40 sccm of Ar at 1.5 mTorr, and a distance of 2.5 cm between a Ta target and the wafer. In this experiment, the chamber pressure was varied over the range of about 1-11 mTorr. It is clearly shown that a variation in deposition pressure provides substantial range for "tuning" the created stress in the deposited Ta layer from compressive at lower chamber pressures to tensile at higher pressures.

Thus, by selecting both the desired film stress and film thickness of the metallic stress compensation layer it affords two degrees of freedom by which to control the desired level of stress compensation to eliminate or tailor the wafer bow of an epitaxial wafer. In one particular embodiment, a thinned VCSEL wafer with an ohmic contact stack of 2400 Å, a 500 Å Ti adhesion layer formed on the ohmic stack, a 2500 Å TiW stress compensation layer deposited on the Ti adhesion layer, and an 800 Å Au passivation layer resulted in providing a substantially flat final wafer structure when the wafer was demounted from the carrier disc.

FIG. 19 is a flowchart of a set of exemplary process steps 1900 used to fabricate a VCSEL laser diode, beginning with a conventional semiconductor substrate (e.g., GaAs or InP), including the formation of a metallic stress compensation structure in accordance with the present invention.

Beginning with step 1902, a substrate is provided which includes a plurality of epitaxial layers formed on its top major surface (i.e., an "epi wafer"). These epitaxial layers are used to form the first, and second DBRs of VCSEL devices (such as first DBR 134 and second DBR 138 shown in FIG. 13). The deposition and subtractive patterning processes continue, shown as step 1904, by building up the structure as shown in FIG. 13, including the active region and electrical contacts to the second DBR. Next, in step 1906, the epitaxial wafer, having completed frontside processing, is attached frontside-down to a carrier disc, leaving the backside of the wafer exposed. Then, the wafer is thinned by a conventional process such as grinding and/or chemical-mechanical polishing in step 1908, resulting in a thinned wafer (which remains attached to the carrier disc, as shown in FIG. 7).

In the formation of VCSEL devices, the next step in the process (shown as step 1910 in FIG. 19) is the deposition of the backside ohmic contact metal layer. This deposition may be formed by using evaporation or a sputtering process similar to that used to form the metallic stress compensation structure. The ohmic metal layer is optionally patterned to form individual or groups of ohmic contacts, used with separate VCSEL devices after singulation of the wafer in a later step.

Next, in step 1912, the inventive metallic stress compensation structure is deposited on the ohmic metal layer. As discussed above, the metallic stress compensation structure may comprise a stress compensation layer only, or a combination of an adhesion layer and a stress compensation layer. Moreover, the stress compensation layer itself may comprise a plurality of stacked sub-layers (i.e., a "multilayer structure"). It is to be understood that a passivation layer may also be deposited with the adhesion and stress compensation layer in the sputtering system at the same time, before proceeding to the next step in processing.

The deposited layers are then optionally patterned in step 1914 to form "streets" therein, as needed for when the wafer is eventually singulated by laser dicing, saw dicing, or chemical etching. The carrier disc is separated from the wafer in step 1916 (i.e., the wafer is "demounted" from the carrier disc), where in accordance with the principles of the present invention the demounted wafer remains essentially flat after its removal, significantly reducing the chance for wafer breakage to occur. Additional and optional processing steps, such as testing, cleaning, additional passivation coating deposition, etc., may then be performed and finally in step 1918 the wafer is singulated (as described above) to produce individual VCSEL dies. The singulated VCSELs are then packaged in step 1820.

It will be appreciated by those skilled in the art that changes may be made to the embodiment described above without departing from the broad inventive concept thereof. It is understood, therefore, that this invention is not limited to the particular embodiment disclosed, but it is intended to cover modifications within the spirit and scope of the inventive concept as defined by the appended claims.

What is claimed is:

1. A stress-compensated epitaxial wafer comprising:
   a semiconductor substrate having first and second opposing major surfaces;
   a plurality of epitaxial layers of either one of alternating and variable composition formed on the first major surface of the substrate, creating stress within the wafer; and
   a metallic stress compensation structure deposited on the second, opposing major surface of the substrate, wherein a bowing in the wafer attributed to the stress created by the plurality of epitaxial layers is substantially offset by one or more controllable characteristics of the metallic stress compensation structure.

2. The stress-compensated epitaxial wafer as defined in claim 1 wherein the metallic stress compensation structure comprises at least one metallic layer formed from the group consisting of metals and metal alloys.

3. The stress-compensated epitaxial wafer as defined in claim 2 wherein the metals are selected from the group consisting of: Be, Ti, Cr, Fe, Co, Ni, Cu, Mo, Ru, Rh, Pd, Ta, W, Re, Ir, and Pt.

4. The stress-compensated epitaxial wafer as defined in claim 2 wherein the metal alloys are selected from the group consisting of: TiW, TaW, NiV, NiAl, NiTi, NiCrMo, CoCr, TaAl, TaTi, MoAl, MoCr, MoTi, as well as conductive nitrides and silicides of these metal alloys.

5. The stress-compensated wafer as defined in claim 1 wherein the controllable characteristics includes a thickness of the metallic stress compensation structure.

6. The stress-compensated wafer as defined in claim 1 wherein the controllable characteristics include a set of processing conditions associated with the creation of the metallic stress compensation structure.

7. The stress-compensated epitaxial wafer as defined in claim 1 wherein the metallic stress compensation structure is deposited on the second, opposing major surface of a pre-process epitaxial wafer to compensate for initial wafer bow.

8. The stress-compensated epitaxial wafer as defined in claim 7 wherein the metallic stress compensation structure comprises a single metallic layer.

9. The stress-compensated epitaxial wafer as defined in claim 7 wherein the metallic stress compensation structure comprises a metallic adhesion layer bonded to the second, opposing major surface of the pre-process epitaxial wafer and a metallic stress compensation layer deposited over the metallic adhesion layer.

10. The stress-compensated epitaxial wafer as defined in claim 9 wherein the metallic adhesion layer comprises Ti and the metallic stress compensation layer is selected from a group consisting of: TiW and Ta.

11. The stress-compensated epitaxial wafer as defined in claim 9 wherein the metallic adhesion layer comprises Ta and the metallic stress compensation layer is selected from the group consisting of: TiW and Ta.

12. The stress-compensated epitaxial wafer as defined in claim 1 wherein the metallic stress compensation structure is disposed on the second, opposing major surface of a thinned epitaxial wafer subsequent to frontside device fabrication processes.

13. The stress-compensated epitaxial wafer as defined in claim 12 wherein the wafer further comprises an ohmic contact structure formed between the second, opposing major surface of the thinned epitaxial wafer and the metallic stress compensation structure.

14. The stress-compensated epitaxial wafer as defined in claim 13 wherein the ohmic contact structure comprises a multi-layer structure of Au—Ge based materials.

15. The stress-compensated epitaxial wafer as defined in claim 12 wherein the metallic stress compensation structure comprises a single metallic layer deposited on the second, opposing major surface of the thinned epitaxial wafer.

16. The stress-compensated epitaxial wafer as defined in claim 12 wherein the metallic stress compensation structure comprises a metallic adhesion layer bonded to the second, opposing major surface of the thinned epitaxial wafer and a metallic stress compensation layer deposited over the metallic adhesion layer.

17. The stress-compensated epitaxial wafer as defined in claim 16 wherein the metallic stress compensation layer is a multilayer configuration, comprising a plurality of sub-layers, adjacent sub-layers having different compositions and contributing different amounts of stress to compensate for the bow present in the epitaxial wafer.

18. The stress-compensated epitaxial wafer as defined in claim 12 wherein the epitaxial wafer further comprises a passivation layer disposed over the metallic stress compensation structure, the passivation layer formed of a material that reduces oxidation of the metallic stress compensation structure.

19. The stress-compensated epitaxial wafer as defined in claim 18 wherein the passivation layer is formed of a noble metal selected from the group consisting of: Au, Ag, Cu, Pd, and Pt.

20. The stress-compensated epitaxial wafer as defined in claim 12 wherein the wafer further comprises a solder attachment structure disposed over the metallic stress compensation structure.

21. A method of forming a stress-compensated epitaxial wafer by:
   obtaining a semiconductor substrate having a plurality of epitaxial layers of either one of alternating and variable composition formed on a top major surface thereof;
   measuring a wafer bow of the obtained semiconductor substrate;
   depositing a metallic stress compensation structure on an opposing, bottom major surface of the semiconductor substrate, wherein a defined thickness of the metallic stress compensation structure is deposited to sufficiently compensate for the wafer bow to form an essentially flat, stress-compensated epitaxial wafer.

22. A method of minimizing wafer bow in thinned, post-process epitaxial wafers, the method comprising:
    providing a thinned epitaxial wafer mounted frontside-down on a support structure, exposing a backside substrate surface of the thinned epitaxial wafer;
    depositing a metallic stress compensation structure over the exposed backside bottom substrate surface, while controlling parameters of the deposited metallic stress compensation structure to compensate for wafer bow; and
    demounting the epitaxial wafer from the support structure.

23. The method as defined in claim 22 wherein the method includes the step of
    forming an ohmic contact layer on the exposed backside substrate surface prior to depositing the metallic stress compensation structure.

24. The method as defined in claim 22 wherein the step of depositing a metallic stress compensation structure comprises the steps of:
    depositing a metallic adhesion layer over the exposed bottom substrate surface; and
    depositing a metallic stress compensation layer over the deposited metallic adhesion layer.

25. The method as defined in claim 24, including the further step of:
    depositing a passivation layer over the deposited metallic stress compensation layer.

26. The method as defined in claim 22 wherein at least one parameter controlled during the depositing step is the thickness of the metallic stress compensation structure.

27. The method as defined in claim 22 wherein a sputter deposition system is used in the depositing step.

28. The method as defined in claim 27, wherein at least one parameter controlled during the depositing step is a process parameter of the sputter deposition system.

29. The method as defined in claim 27 wherein the process parameter of the sputter deposition system is selected from the group consisting of: deposition system pressure, deposition system target power, and deposition system separation between a target and the epitaxial wafer.

* * * * *